United States Patent
Su et al.

(10) Patent No.: US 7,184,937 B1
(45) Date of Patent: Feb. 27, 2007

(54) SIGNAL REPETITION-RATE AND FREQUENCY-DRIFT ESTIMATOR USING PROPORTIONAL-DELAYED ZERO-CROSSING TECHNIQUES

(75) Inventors: Wei Su, Englishtown, NJ (US); John A. Kosinski, Wall Township, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 11/183,219

(22) Filed: Jul. 14, 2005

(51) Int. Cl.
 *G06F 15/00* (2006.01)
(52) U.S. Cl. .................. 702/189; 702/69; 324/536; 363/41; 348/607; 348/192; 704/219
(58) Field of Classification Search .......... 702/69, 702/189; 324/536; 363/41; 348/607, 192; 704/219
See application file for complete search history.

(56) References Cited

U.S. PATENT DOCUMENTS

| | | | | |
|---|---|---|---|---|
| 6,285,310 | B1 * | 9/2001 | Michaelis et al. .......... | 341/166 |
| 6,594,595 | B2 * | 7/2003 | Yamaguchi et al. .......... | 702/69 |
| 7,085,949 | B2 * | 8/2006 | Mar et al. .................. | 713/400 |
| 2002/0016711 | A1 * | 2/2002 | Manjunath et al. .......... | 704/258 |
| 2002/0099548 | A1 * | 7/2002 | Manjunath et al. ......... | 704/266 |
| 2003/0018442 | A1 * | 1/2003 | Yamaguchi et al. .......... | 702/69 |
| 2004/0102969 | A1 * | 5/2004 | Manjunath et al. ......... | 704/229 |
| 2004/0107376 | A1 * | 6/2004 | Mar et al. ................... | 341/166 |

\* cited by examiner

*Primary Examiner*—Carol S. W. Tsai
(74) *Attorney, Agent, or Firm*—Michael Zelenka; George B. Tereschuk (57) ABSTRACT

Proportional-delayed zero-crossing frequency-drift estimator devices are provided. Given N-number of time samples, the current zero-crossing time estimation technique uses only two zero-crossing time samples for repetition-rate estimation. The term "zero-crossing point" refers to the point where a sinusoidal waveform varies from a positive to a negative value and crosses the zero value in the process. The proportional-delayed zero-crossing frequency-drift estimator devices employ four zero-crossing time samples by utilizing both proportional zero-crossing points for current information and delayed zero-crossing points for past information so that the noises in the time samples will be smoothed out making a less noisy estimation. The proportional-delayed zero-crossing frequency-drift estimators are composed of a hysteretic nonlinear converter, a zero-crossing time-difference counter, a group of shift registers and adders, a repetition-rate algorithm, a reciprocal operator and a means for differentiation operation. A number of different embodiments are provided, but all embodiments include a hysteretic nonlinear converter which enhances the zero-crossing features and blocks the signal random noise so that the zero-crossing point is measured more accurately.

18 Claims, 4 Drawing Sheets

SIGNAL REPETITION-RATE AND FREQUENCY-DRIFT ESTIMATOR USING PROPORTIONAL-DELAYED ZERO-CROSSING TECHNIQUES

GOVERNMENT INTEREST

The invention described herein may be manufactured, used, imported and licensed by or for the Government of the United States of America without the payment to us of any royalty thereon.

FIELD OF THE INVENTION

This invention relates generally to the field of signal frequency estimation. In particular, the present invention relates to proportional-delayed zero-crossing estimation devices.

BACKGROUND OF THE INVENTION

A number of estimation techniques can be useful in estimating parameters such as signal frequency, signal repetition rate, rotation angular velocity, frequency-drift, signal modulation classification and the modulation index.

One current technique used in the estimation area is the zero-crossing (or level-crossing) signal repetition test, which is used in frequency estimation, frequency-drift estimation, angular velocity estimation and signal modulation classification. This method takes the average of the time differences between two zero-crossing points of a periodic function. Given N-number of time samples, the existing zero-crossing time estimation technique uses only two zero-crossing time samples for repetition-rate estimation so that it is not robust to random noise and unexpected DC bias in a signal g(x).

The zero-crossing time estimation technique of the prior art is based on a number of important mathematical expressions. Assume in a given time domain $x_L \leq x \leq x_R$, the signal g(x) is periodic and has N number of zero-crossing time samples, or measurements, denoted by x(k), x(k−1), ..., x(k−N+1), such that g[x(k)]=g[x(k−1)]= ... =g[x(k−N+1)]=0. The repetition-rate of g(x) in prior art is estimated by the time average:

$$z(k) = \frac{2}{N-1} \sum_{j=0}^{N-2} [x(k-j) - x(k-j-1)] \cdot \quad (1)$$

$$= 2 \cdot \frac{x(k) - x(k-N+1)}{N-1},$$

By definition, the frequency of g(x) will be:

$$f(k) = \frac{1}{z(k)}, \quad (2)$$

and the frequency-difference will be:

$$\alpha(k) = f(k) - f(k-1). \quad (3)$$

Although moving average estimation is used, the prior art estimation relies on only two zero-crossing samples: the first and the last zero-crossing samples for repetition-rate estimation so that it is not robust to random noise, overly sensitive to unexpected DC bias of g(x) and also unreliable.

Thus, there has been a long-felt need for zero-crossing time estimation devices and techniques that do not suffer from the disadvantages, shortcomings and limitations of two-sample estimation, including susceptibility to random noise, sensitivity to unexpected DC bias and lack of reliability. The present inventors have developed a proportional-delayed zero-crossing frequency-drift estimator device that is more robust, reliable and less noisy than the prior art zero-crossing two-sample estimation techniques and does not suffer from the disadvantages, shortcomings and limitations of current estimation techniques.

SUMMARY OF THE INVENTION

It is an object of the present invention to provide a proportional-delayed zero-crossing frequency-drift estimator device.

It is another object of the present invention to provide a proportional-delayed zero-crossing frequency-drift estimator device that extracts more information from a greater number of samples and is less noisy than prior art techniques.

It is yet another object of the present invention to provide a proportional-delayed zero-crossing frequency-drift estimator device with a means for signal repetition-rate estimation that extracts more information from a greater number of samples, is less noisy and is more reliable than prior art techniques.

It is also an object of the present invention to provide a proportional-delayed zero-crossing frequency-drift estimator device with a recursive embodiment of the signal repetition-rate estimating means that extracts more information from a greater number of samples, is less noisy and is more reliable than the prior art.

It is still a further object of the present invention to provide a proportional-delayed zero-crossing frequency-drift estimator device with a rising-edge falling-edge embodiment of the signal repetition-rate estimating means that extracts more information from a greater number of samples, is less noisy and is more reliable.

These and other objects and advantages are accomplished with this invention's proportional-delayed ("PD") zero-crossing frequency-drift estimator devices. The PD zero-crossing frequency-drift estimator device comprises a hysteretic nonlinear converter, a zero-crossing time-difference counter, a means for estimating signal repetition rates, a repetition-rate algorithm, a reciprocal operator and a means for differentiation operation that is more robust, reliable and less noisy than the prior art two-sample zero-crossing estimation techniques. Given N-number of time samples, the existing zero-crossing time estimation technique uses only two zero-crossing time samples for repetition-rate estimation so that it is not reliable and not robust. However, this invention's PD zero-crossing frequency-drift estimator devices employ four zero-crossing time samples by utilizing both proportional zero-crossing points for current information and delayed zero-crossing points for past information so that the noises in the time samples will be smoothed out making a less noisy estimation. The signal repetition-rate estimation means in the first embodiment is a group of shift registers and adders. A number of different embodiments of the signal repetition-rate estimation means are also provided. All embodiments include a hysteretic nonlinear converter which enhances the zero-crossing features and blocks the signal random noise so that the zero-crossing point is measured more accurately.

The term "zero-crossing point" refers to the point where a sinusoidal waveform varies from a positive to a negative value and crosses the zero value in the process. This means that a waveform with only a positive or a negative value has no zero-crossing point, but if it varies up or down it may cross a given non-zero level, which is also known as the level-crossing point. Level-crossing is a general case for zero-crossing. Thus, when the level equals zero, level-crossing is equivalent to zero-crossing.

The present invention seeks to more accurately measure the zero-crossing point and this is significant because communications signal waveforms are usually periodic functions that oscillate up and down, therefore the zero-crossing point and level-crossing point are features to indicate the waveform types and estimate characteristics such as the changing rate or frequency. This invention encompasses several PD estimator devices having different embodiments of the signal repetition-rate estimation means, including a rising-edge falling edge signal repetition-rate estimation means and a recursive signal repetition-rate estimation means.

DETAILED DESCRIPTION OF THE DRAWINGS

The PD zero-crossing estimator devices of the present invention reuse the zero-crossing time samples, eliminate random noise, are more robust and are far more effective in estimating the repetition-rate than prior art techniques. The PD zero-crossing estimator devices of the present invention are provided for estimating signal repetition-rate, signal frequency, frequency-drift, modulation-index and analyzing modulation types, without suffering from the prior art disadvantages, shortcomings and limitations of susceptibility to random noise, sensitivity to low-frequency bias and unreliability. It can be implemented easily by using low-cost commercial-off-the-shelf (COTS) hardware or it can be implemented in software. The PD zero-crossing estimator can also be used to estimate oscillating frequency, frequency-aging, and analysis of the modulation type of a phase or frequency modulated signal. The PD zero-crossing estimator of the present invention provides several embodiments of a means for signal repetition-rate estimation.

Figure 1:
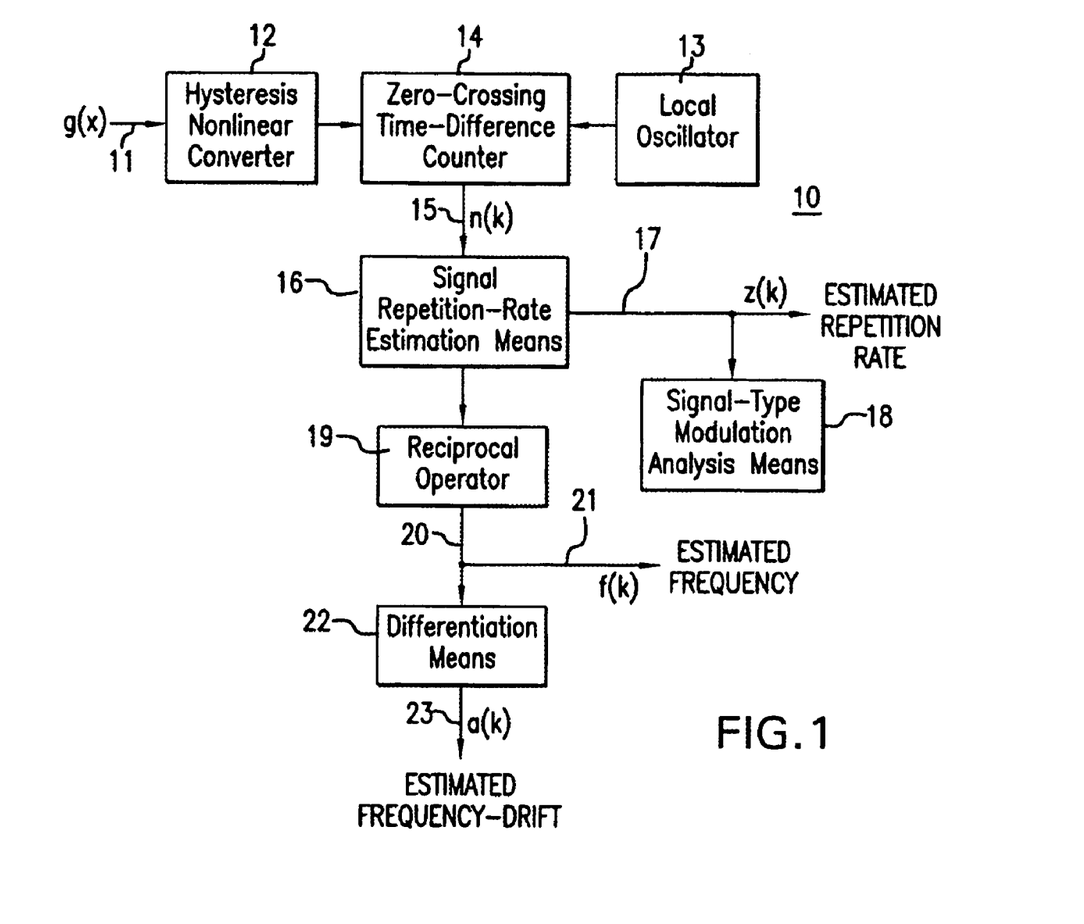
FIG. 1 is a conceptual block diagram of a basic PD zero-crossing estimator device in accordance with the present invention.

Referring now to the drawings, FIG. 1 is a conceptual block diagram of a basic PD zero-crossing estimator device 10. The device comprises a hysteretic nonlinear converter 12, a local oscillator 13, a zero-crossing time-difference counter 14, a means for signal repetition-rate estimation 16, a repetition-rate algorithm, a means for analyzing signal modulation type 18, a reciprocal operator 19 and a means for differentiation 22. Signal g(x) 11 is sent to the hysteretic nonlinear converter 12 to remove the random amplitude fluctuations of g(x) at the zero-crossing points. The periodic signal g(x) 11 under test can be either analog or digital. The zero-crossing time, x(k), is detected whenever g(x)=0. Counter 14 counts the zero-crossing time difference between two consecutive time samples. The counter output, n(k), represented by arrow 15, is fed to the signal repetition-rate estimation means 16 for repetition-rate estimation, which is used by the reciprocal operator 19 for frequency calculation. The repetition-rate is also used by the signal-type modulation analysis means 18 for modulation type analysis and modulation-index estimation. An estimated frequency output 20 is sent to the differentiation means 22 for the frequency-aging estimation output 23 or an estimated frequency-drift output.

In operation, the hysteretic nonlinear converter 12 converts a continuous periodic waveform, such as a sinusoid, to a square waveform with the same repetition rate but much steeper zero-crossing edges to enhance the zero-crossing detection. The hysteresis also adds the delay thresholds (−α, α) to the amplitude of signal g(x) 11 in order to suppress random noise fluctuations. The value of the delay threshold, α, can be adjusted either by the user, or by an automatic circuit, based on the signal-to-noise ratio of signal g(x) 11.

Figure 2:
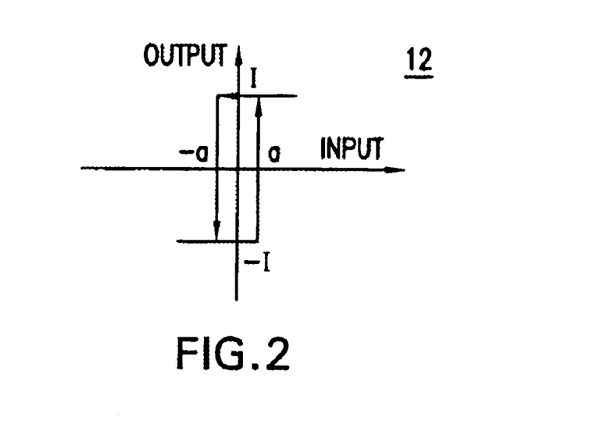
FIG. 2 illustrates the input-output relationship of the hysteretic nonlinear converter of the present invention.

FIG. 2 illustrates the input-output relationship of the hysteretic nonlinear converter 12 of the PD zero-crossing estimator device 10. The output of the hysteretic nonlinear converter 12 will be either I or −I, depending on the value and incremental direction of the input. While the input is increasing, if the value of the input is larger than delay threshold, α, the output will be I. Otherwise, it will be −I. While the input is decreasing, if the value of the input is smaller than delay threshold, −α, the output will be −I. Otherwise, it will be I. In accordance with the present invention, the quality of the zero-crossing detection is affected by the slope of the signal amplitude; therefore the hysteretic nonlinear converter 12 insures high quality zero-crossing time measurements.

The zero-crossing time-difference counter 14 senses the zero-crossings of signal g(x) 11 and measures the number of pulses, denoted by n(k), of the local oscillator 13 between two consecutive zero-crossing points in the counter output 15. When an either-edge zero-crossing time-difference counter is used, both rising-edge and falling edge zero-crossing points are detected. When a rising-edge or falling-edge zero-crossing time-difference counter is used, only the rising-edge or falling edge zero-crossing points are detected. We can define the equation:

$$y(k)=x(k)-x(k-1) \qquad (4)$$

as the either-edge zero-crossing time-difference between two consecutive crossing time samples: x(k) and x(k−1). When a zero-crossing point is detected, that is whenever g(x(k))=0, the counter 14 reports the current value of counter output 15, n(k). Then, it is reset to zero for counting the next state n(k+1). Therefore, the time difference y(k) is counted by n(k) as shown below:

$$y(k)=K_f n(k) \quad (5)$$

where $K_f$ is the oscillating rate of the local oscillator 13.

The signal repetition-rate estimation means 16 estimates the repetition-rate of g(x) based on the counter output 15 according to the following equation:

$$z(k) = \frac{1-D}{N-2} \cdot \sum_{i=0}^{N-3} y(k-i) \quad (6)$$

$$= K \cdot (1-D) \cdot \sum_{i=0}^{N-3} n(k)$$

where $K=K_f/(N-2)$ is a calibration constant and D is a one-step delay operator. That is $$D[y(k)]=y(k-1) \quad (7)$$

The FIG. 1 reciprocal operator 18 converts the repetition-rate to an oscillating frequency using Equation 2. The FIG. 1 differentiation means 21 calculates the frequency-difference using Equation 3. The frequency-drift is described by the frequency-difference if signal g(x) 11 is not frequency modulated. Then, frequency-aging can be represented by the frequency-drift if the drift is dominated by the component aging. The FIG. 1 signal-type modulation analysis means 19 separates frequency-modulated signals from the other signal types, such as phase or amplitude modulated signals, based on the variance of the estimated frequency. A large frequency variation indicates a frequency-modulated signal and a decision tree is needed for analysis. The hysteretic nonlinear converter 12 can be implemented by using either hardware or software.

Figure 3:
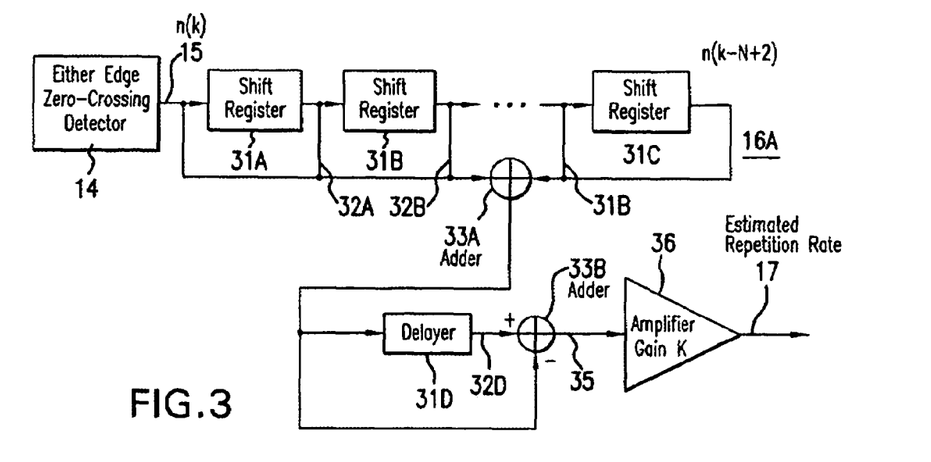
FIG. 3 is a conceptual block diagram depicting one embodiment of the signal repetition-rate estimation means of the PD zero-crossing estimator device of the present invention.

The signal repetition-rate estimation means 16 can be implemented by a group of shift-registers and adders as shown in the FIG. 3 embodiment. Referring now to FIG. 3, this embodiment of the signal repetition estimation means 16A comprises a group of shift registers 31A–31C, a delayer 31D, shift register outputs 32A–32D, adders 33A and 33B and amplifier 36. In operation, the zero-crossing time difference counter 14 provides counter output 15 to the shift registers 31A–31C, which electronically adds signals, or pieces of data, together using the adder 33A. The adder output 33A is sent to the delayer 31D to form a delayed path 32D. Then, both the proportional path (the output of 33A) and the delayed path 32D are combined by a second adder 33B to form a combined output 35. Amplifier 36 provides gain adjustment to the combined output 35 to form a filtered estimated result output, z(k), represented by arrow 17, which is sent to the signal modulation type analyzer 18. In this embodiment, the zero-crossing time difference, n(k), is used for estimation and the filtered estimated result output, z(k), 17 has been calibrated by the gain K from amplifier 36.

Figure 4:
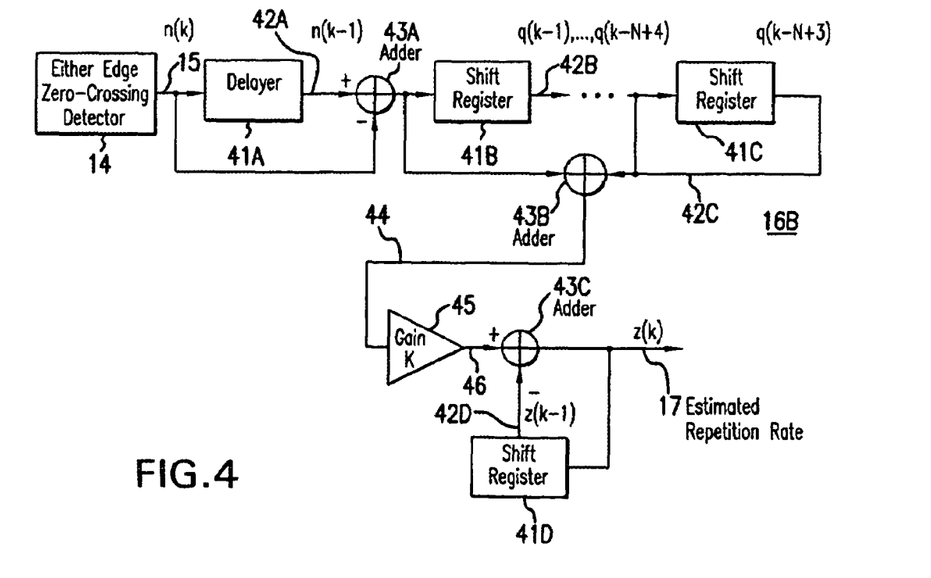
FIG. 4 is a conceptual block diagram depicting a recursive embodiment of the signal repetition-rate estimation means of the PD zero-crossing estimator device of the present invention.

In another embodiment, the repetition rate estimation in Equation 6 provided by the signal repetition-rate estimation means 16A can also be the recursive signal repetition-rate estimation means 16B that is depicted in FIG. 4. Defining:

$$q(k)=n(k)-n(k-1) \quad (8)$$

and substituting Equation 8 into Equation 6 results the in recursive technique of this embodiment according to this expression:

$$z(k) = \frac{1}{N-2} \cdot \left[ \sum_{i=0}^{N-3} y(k-i) - \sum_{i=0}^{N-3} y(k-1-i) \right] \quad (9)$$

$$= K \cdot \sum_{i=0}^{N-3} q(k-i)$$

$$= K \cdot \sum_{i=-1}^{N-4} q(k-i-1)$$

$$= z(k-1) + K \cdot [q(k) - q(k-N+2)]$$

Referring now to FIG. 4, a group of shift-registers and adders provide a recursive signal repetition-rate estimating means 16B using a feedback loop. Referring now to FIG. 4, the recursive signal repetition estimating means 16B further comprises a delayer 41A, a delayed path 42A, a group of shift registers 41B–41D, shift register outputs 42B–42D, adders 43A–43C and an amplifier 45. In operation, the zero-crossing time difference counter 14 provides a counter output 15. This counter output 15 is sent to a delayer 41A to form a delayed path 42A. Then both the proportional path 15 and delayed path 42A are combined by the first adder 43A. The output of the first adder goes to first plurality of shift registers 41B–41C, and the first plurality of shift registers 41B–41C sends a shift register output to a second adder 43B that sends a combined output 44 to amplifier 45. Amplifier 45 provides a gain adjustment to the combined output 44 and generates a filtered output 46 to third adder 43C, which then provides the estimated result output, z(k), represented by arrow 17, to the signal modulation type analyzer means 18. In this recursive embodiment, the feedback loop permits using less hardware and can be considered more computationally efficient than the FIG. 3 embodiment. A feedback z(k-1), represented by arrow 42D via shift register 41D, is used in calculating the estimated result output, z(k), 17. The zero-crossing time difference, n(k), is used for estimation. The estimation result output, z(k), 17 is calibrated by the gain K of amplifier 45.

Figure 5:
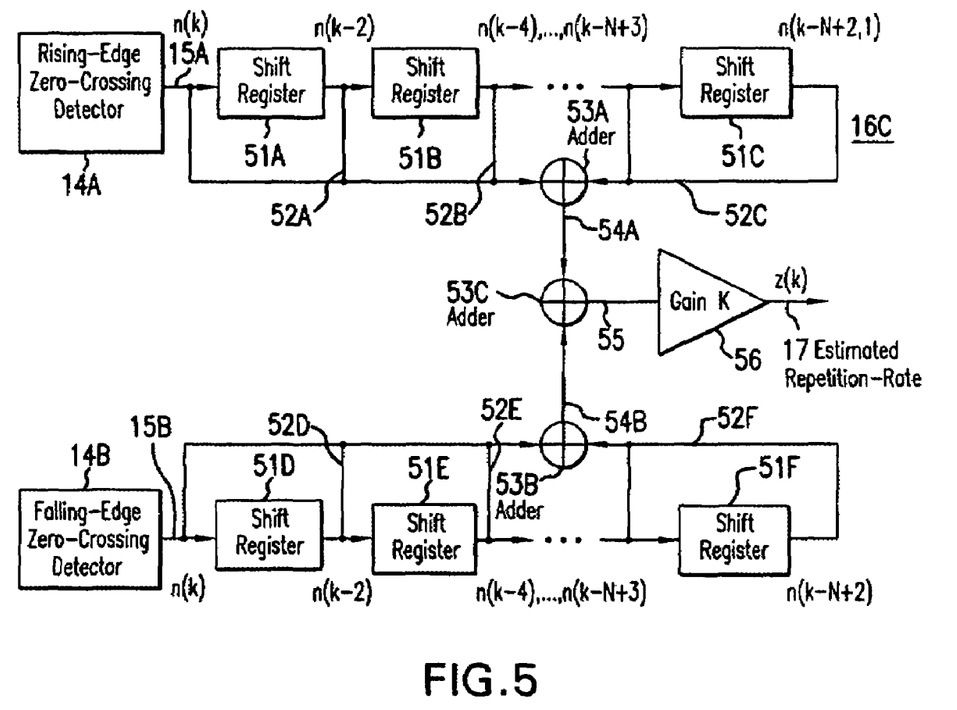
FIG. 5 is a conceptual block diagram depicting a rising-edge falling-edge embodiment of the signal repetition-rate estimation means of the PD zero-crossing estimator device of the present invention.

FIG. 5 illustrates that when a rising-edge zero-crossing time-difference counter 14A and falling-edge zero-crossing time-difference counter 14B provide input, the estimation operation mathematically described in Equation 6 can be implemented with the rising-edge falling-edge embodiment of the signal repetition-rate estimating means 16C depicted here. The PD zero-crossing estimator device with a rising-edge falling-edge signal repetition-rate estimating means 16C further comprises a rising-edge time difference counter 14A sending a rising time counter output 15A to a first group of shift registers 51A–51C. The first group of shift registers 51A–51C provides first shift register outputs 52A–52C to first adder 53A. A falling-edge time difference counter 14B sends a falling time counter output 15B to a second group of shift registers 51D–51F. The second group of shift registers 51D–51F provides second shift register outputs 52D–52F to second adder 53B. First and second adders 53A and 53B, respectively, provide filtered signal outputs 54A and 54B, respectively, to third adder 53C, which provides filtered output 55 to amplifier 56. In operation, the rising-edge and falling-edge time difference counters 14A and 14B, respectively, provide counter outputs 15A and 15B, respectively, to the groups of shift registers 51A–51C and 51D–51F, and adder 53C provides a filtered output 55 to amplifier 56, which then provides a filtered estimated result output, z(k), arrow 17 to the signal modulation type analyzer means 18. The estimation result, z(k), arrow 17, is calibrated by the gain K from amplifier 56.

In operation and now referring back to FIG. 1, the reciprocal operator 19 converts the repetition rate to an oscillating frequency using Equation 2. The differentiation means 22 calculates the frequency difference using Equation 3. The frequency-drift is described by the frequency-difference if signal g(x) 11 is not frequency modulated, so that frequency-aging can be represented by the frequency-drift if the drift is dominated by the component aging. The signal-modulation type analysis means 18 separates is frequency-modulated signals from other types of signals, such as phase or amplitude modulated signals, based on the variance of the estimated frequency, with a large frequency variation indicating a frequency-modulated signal. A decision-tree will be used for analysis. Since the frequency is the reciprocal of the repetition-rate, the repetition-rate can be used directly for modulation analysis. In other words, only the variance of the repetition-rate will be needed.

The frequency modulation-index of a frequency-modulated signal is described by the frequency difference. Therefore, it can also be estimated directly by using the repetition-rate. For example, if signal g(x) 11 is an FSK signal with an average higher repetition-rate of $z_{high}$ and an average lower repetition-rate of $z_{low}$, then, the modulation-index will be estimated according to the equation:

$$I_h = \frac{z_{high} - z_{low}}{z_{high} z_{low}} T \quad (10)$$

where T is the symbol time which is assumed to be known or can be estimated by other means. The modulation-index is a useful feature for modulation analysis.

Figure 6:
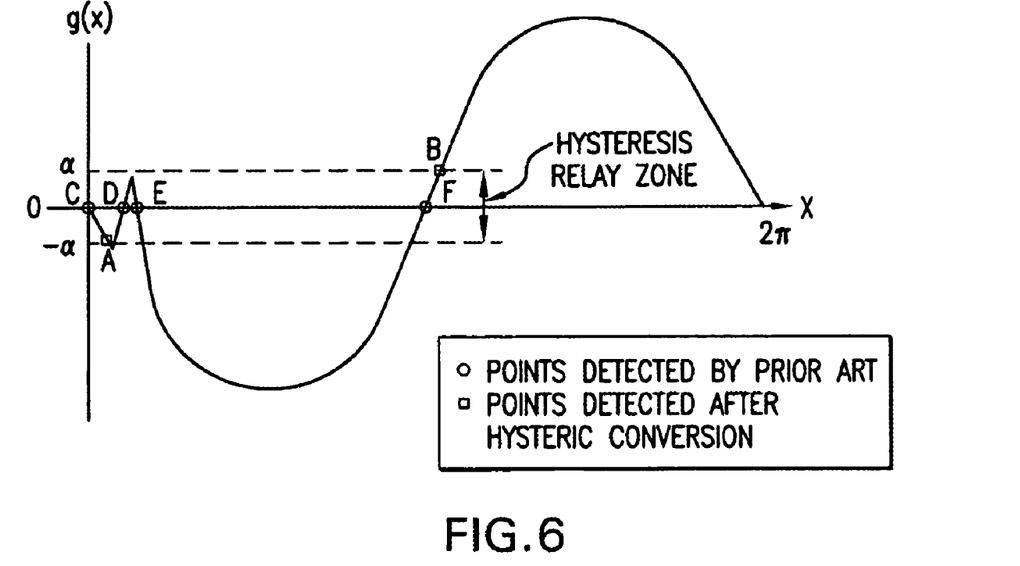
FIG. 6 is a chart depicting a sinusoid waveform with an unexpected spike to illustrate the salient differences between prior art devices and the effectiveness of the PD zero-crossing estimator device of present invention.

FIG. 6 is a chart depicting one example of a sinusoid waveform with an unexpected spike to illustrate some of the salient differences between the prior art and effectiveness of the PD zero-crossing frequency-drift estimator device of present invention. Let g(x)=M·sin x where M>α, and assume that there is a spike near x=0 of the sinusoidal waveform due to random noise or some other disturbances. Circles C, D, E, and F are zero-crossing points between x=0 where x<2π that can be readily detected by current prior art methods. The squares A and B are zero-crossing points detected after the hysteretic conversion in accordance with the present invention. The two horizontal dashed-lines bounded by -α and α illustrate the hysteresis relay zone. Points D and F are faulty detections caused by the spike. The repetition-rate estimation of the prior art, Equation 1, yields:

$$z(x) = 2 \cdot \frac{F - C}{3} = \frac{2\pi}{3} \quad (11)$$

The error between the true repetition-rate and the estimated value in the prior art is: 2π−2π/3=π/3. It appears that a single spike in signal g(x) 11 can alter the repetition-rate estimation significantly. When g(x) is noisy, it will generate many faulty zero-crossing points and the repetition-rate will not be estimated reliably by prior art methods. In accordance with the present invention, the hysteretic converter device prevents the spike by introducing a delay threshold zone (α, -α) as shown in FIG. 6. When the peak of the spike is smaller than the threshold α, the output of the hysteretic converter will not be effected and only the two desired zero-crossing points are detected, as shown in FIG. 6, which are denoted by two squares A and B with a time delay $$\delta = \sin^{-1}\frac{\alpha}{M}.$$

Compared with Equation 11, the repetition-rate with the hysteretic conversion is as follows:

$$z(x) = 2(B - A) = 2\left[\sin^{-1}\frac{\alpha}{M} + \pi - \sin^{-1}\frac{\alpha}{M}\right] = 2\pi \quad (12)$$

This is the correct estimation.

Figure 7:
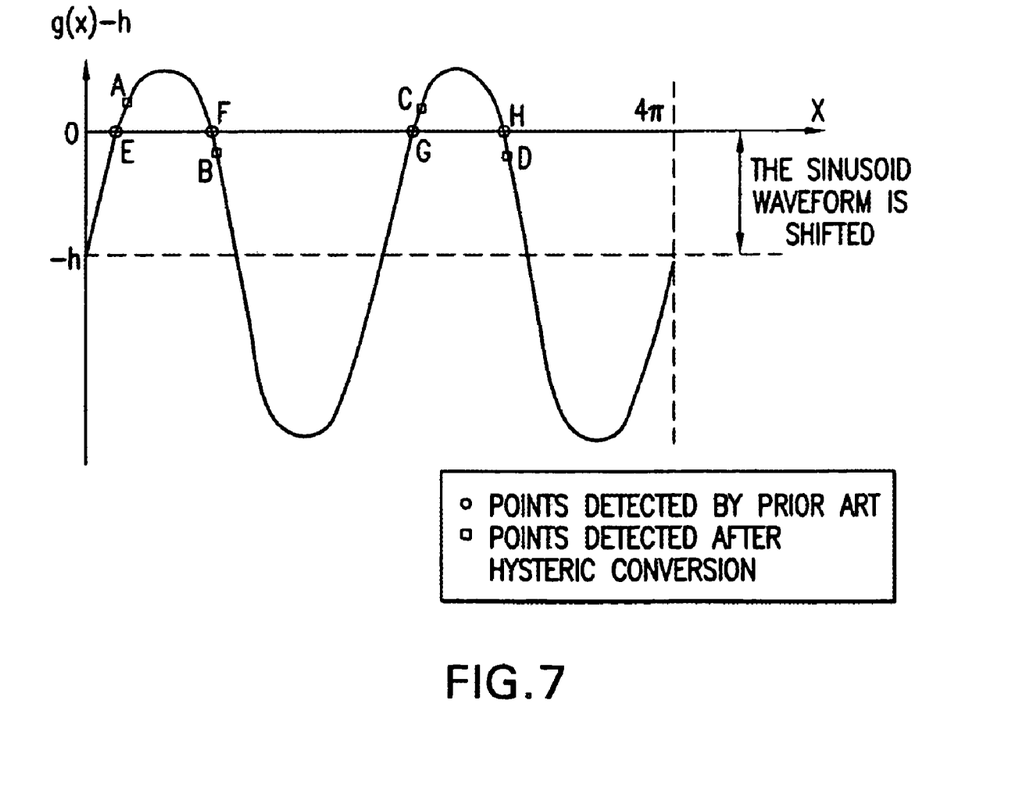
FIG. 7 is a chart depicting a sinusoid waveform with an unexpected shift −h to illustrate a number of salient differences between prior art devices and the effectiveness of the PD zero-crossing estimator device of present invention.

A second example is shown in FIG. 7, which is a chart depicting a sinusoidal waveform with an unexpected shift -h to illustrate some of the salient differences between the prior art and effectiveness of the signal repetition-rate estimator device of present invention. Circles E, F, G and H are zero-crossing points detected by the current prior art method, and squares A, B, C and D represent zero-crossing points detected after the hysteretic conversion. In this second example, let g(x)=-h+M·sin x where M-h>α and assume that the mean value of the sinusoidal waveform is shifted from zero to -h, due to residual DC or other interference. In this case, there are four zero-crossing points, denoted by circles: E, F, G, and H in FIG. 6 between x=0 and x<4π. The prior art method will estimate the repetition-rate by $$z(x) = 2 \cdot \frac{H - E}{3} \quad (13)$$

Consider as an example $$h = M \sin\frac{\pi}{4}.$$

Equation 13 becomes $$z(x) = \frac{2}{3} \cdot \left(\frac{5\pi}{2} - \frac{\pi}{4}\right) = \frac{3\pi}{2} \quad (14)$$

The error between the true repetition-rate and the estimated value is 2π−2π/3=π/3. The techniques of the present invention detected four different zero-crossing points after the hysteretic conversion as shown in FIG. 7 by squares: A, B, C, and D with a delay of $$\delta = \sin^{-1}\frac{\alpha}{M}.$$

The repetition-rate is estimated by Equation 9 to yield $$z(x) = \frac{C+D}{2} - \frac{A+B}{2} = \frac{1}{2}\left[\left(\frac{9\pi}{4} + \frac{11\pi}{4} + 2\delta\right) - \left(\frac{\pi}{4} + \frac{3\pi}{4} + 2\delta\right)\right] = 2\pi \quad (15)$$

which is the correct estimation.

These embodiments of the present invention are intended to be illustrative and not limiting with respect to the variety of possible embodiments. It is to be further understood that other features and modifications to the foregoing detailed description of the estimating methods and devices are all considered to be within the contemplation of the present invention, which is not limited by this detailed description. Those skilled in the art will readily appreciate that any number of configurations of the present invention and numerous modifications and combinations of materials, components, geometrical arrangements and dimensions can achieve the results described herein, without departing from the spirit and scope of this invention. Accordingly, the present invention should not be limited by the foregoing description, but only by the appended claims.

What we claim is:

1. A proportional-delayed zero-crossing estimator device, comprising:

a periodic signal, g(x), is sent to a hysteretic nonlinear converter, said signal g(x) having an amplitude, a plurality of random amplitude fluctuations at multiple zero crossing points and a susceptibility to random noise;

said converter adds a positive delay threshold, α, and a negative delay threshold, −α, to said amplitude to suppress a plurality of random noise fluctuations;

a zero crossing time-difference counter detects a zero crossing time, x(k), whenever said signal g(x)=0;

said counter counts a zero-crossing time difference between any two consecutive time samples, x(k) and x(k−1), of the multiple zero crossing points, measures a multitude of pulses from a local oscillator between said two consecutive time samples, reports a current value of a counter output, n(k), and resets to zero in order to count a next state of n(k+1);

said counter feeds said counter output to a means for signal repetition-rate estimation, said signal repetition estimation means, having a repetition-rate algorithm, provides a repetition-rate estimate of the signal g(x) to a means for analyzing signal modulation type and a reciprocal operator for frequency calculation purposes;

said signal modulation analysis means with the repetition-rate estimation forms a modulation index estimate and a modulation analysis output;

said reciprocal operator with the repetition-rate estimation performs a frequency calculation and sends an estimated frequency output to said signal modulation analysis means;

said reciprocal operator converts said repetition-rate estimate to an oscillating frequency;

said plurality of random amplitude fluctuations at the multiple zero crossing points being removed from said signal g(x); and a means for differentiation receives said estimated frequency output and calculates a frequency difference output, a frequency aging estimate output and an estimated frequency-drift to provide an increased accuracy frequency estimation with a reduced random noise susceptibility.

2. The proportional-delayed zero-crossing estimator device, as recited in claim 1, further comprising said converter converts a continuous periodic waveform to a square waveform with an equivalent repetition rate and a plurality of steep zero-crossing edges for an enhanced zero-crossing detection.

3. The proportional-delayed zero-crossing estimator device, as recited in claim 2, further comprising said positive delay threshold, α, being adjustable based on a signal-to-noise ratio of said signal g(x).

4. The proportional-delayed zero-crossing estimator device, as recited in claim 3, further comprising said repetition-rate estimation being calculated according to the equation:

$$z(k) = \frac{1-D}{N-2} \cdot \sum_{i=0}^{N-3} y(k-i)$$

$$= K \cdot (1-D) \cdot \sum_{i=0}^{N-3} n(k)$$

where said $K=K_f/(N-2)$ is a calibration constant and said D is a one-step delay operator where $D[y(k)]=y(k-1)$.

5. The proportional-delayed zero-crossing estimator device, as recited in claim 4, further comprising said signal repetition estimation means including a group of shift registers, a delayer, shift register outputs, adders and an amplifier.

6. The proportional-delayed zero-crossing estimator device, as recited in claim 5, further comprising:

said counter output is sent to a plurality of shift registers;

a plurality of shift register outputs are sent to a first adder, said first adder sends an adder output with a proportional path to a delayer, said delayer provides a delayed path; and said proportional path and said delayed path are combined by a second adder to form a combined output receiving a gain adjustment from said amplifier to provide a filtered estimated result output, z(k), said filtered estimated result output, z(k), being calibrated by a gain K from said amplifier, is sent to said the signal modulation type analysis means.

7. A rising-edge falling-edge proportional-delayed zero-crossing estimator device, comprising:

a periodic signal, g(x), is sent to a hysteretic nonlinear converter, said signal g(x) having an amplitude, a plurality of random amplitude fluctuations at multiple zero crossing points and a susceptibility to random noise;

said converter adds a positive delay threshold, α, and a negative delay threshold, −α, to said amplitude to suppress a plurality of random noise fluctuations;

a rising-edge time-difference counter and a falling-edge time-difference counter detect a zero crossing time, x(k), whenever said signal g(x)=0;

said counters count a zero-crossing time difference between any two consecutive time samples, x(k) and x(k−1), of the multiple zero crossing points, measure a multitude of pulses from a local oscillator between said two consecutive time samples, report a current value of a rising time counter output and a falling time counter and reset to zero;

said counters feed said rising time counter output and said falling time counter output to a means for signal repetition-rate estimation, said signal repetition estimation means, having a repetition-rate algorithm, provides a repetition-rate estimate of the signal g(x) to a means for analyzing signal modulation type and a reciprocal operator for frequency calculation purposes;

said signal modulation analysis means with the repetition-rate estimation forms a modulation index estimate and a modulation analysis output;

said reciprocal operator with the repetition-rate estimation performs a frequency calculation and sends an estimated frequency output to said signal modulation analysis means;

said reciprocal operator converts said repetition-rate estimate to an oscillating frequency;

said plurality of random amplitude fluctuations at the multiple zero crossing points being removed from said signal g(x); and a means for differentiation receives said estimated frequency output and calculates a frequency difference output, a frequency aging estimate output and an estimated frequency-drift to provide an increased accuracy frequency estimation with a reduced random noise susceptibility.

8. The rising-edge falling-edge proportional-delayed zero-crossing estimator device, as recited in claim 7, further comprising said converter converts a continuous periodic waveform to a square waveform with an equivalent repetition rate and a plurality of steep zero-crossing edges for an enhanced zero-crossing detection.

9. The rising-edge falling-edge proportional-delayed zero-crossing estimator device, as recited in claim 8, further comprising said positive delay threshold, α, being adjustable based on a signal-to-noise ratio of said signal g(x).

10. The rising-edge falling-edge proportional-delayed zero-crossing estimator device, as recited in claim 9, further comprising said repetition-rate estimation being calculated according to the equation:

$$z(k) = \frac{1-D}{N-2} \cdot \sum_{i=0}^{N-3} y(k-i)$$

$$= K \cdot (1-D) \cdot \sum_{i=0}^{N-3} n(k)$$

where said $K=K_c/(N-2)$ is a calibration constant and said D is a one-step delay operator where $D[y(k)]=y(k-1)$.

11. The rising-edge falling-edge proportional-delayed zero-crossing estimator device, as recited in claim 10, further comprising said signal repetition estimation means including a rising-time counter output, a group of shift registers, shift register outputs, adders, a falling-time counter output and an amplifier.

12. The rising-edge falling-edge proportional-delayed zero-crossing estimator device, as recited in claim 11, further comprising:

said rising time counter output is sent to a first plurality of shift registers;

said first plurality of shift registers provides a plurality of first shift register outputs to a first adder;

said falling time counter output is sent to a second group of shift registers;

said second group of shift registers provides a second plurality of shift register outputs to a second adder;

said first adder provides a first filtered signal output to said third adder;

said second adder provides a second filtered signal output to said third adder;

said third adder provides a filtered output to said amplifier; and said amplifier provides a filtered estimated result output, z(k), to said signal modulation type analyzer means, said filtered estimated result output, z(k), being calibrated by a gain K from said amplifier.

13. A recursive proportional-delayed zero-crossing estimator device, comprising:

a periodic signal, g(x), is sent to a hysteretic nonlinear converter, said signal g(x) having an amplitude, a plurality of random amplitude fluctuations at multiple zero crossing points and a susceptibility to random noise;

said converter adds a positive delay threshold, α, and a negative delay threshold, −α, to said amplitude to suppress a plurality of random noise fluctuations;

a zero crossing time-difference counter detects a zero crossing time, x(k), whenever said signal g(x)=0;

said counter counts a zero-crossing time difference between any two consecutive time samples, x(k) and x(k−1), of the multiple zero crossing points, measures a multitude of pulses from a local oscillator between said two consecutive time samples, reports a current value of a counter output, n(k), and resets to zero in order to count a next state of n(k+1);

said counter feeds said counter output to a means for signal repetition-rate estimation, said signal repetition estimation means, having a repetition-rate algorithm, provides a repetition-rate estimate of the signal g(x) to a means for analyzing signal modulation type and a reciprocal operator for frequency calculation purposes;

said signal modulation analysis means with the repetition-rate estimation forms a modulation index estimate and a modulation analysis output;

said reciprocal operator with the repetition-rate estimation performs a frequency calculation and sends an estimated frequency output to said signal modulation analysis means;

said reciprocal operator converts said repetition-rate estimate to an oscillating frequency;

said plurality of random amplitude fluctuations at the multiple zero crossing points being removed from said signal g(x); and a means for differentiation receives said estimated frequency output and calculates a frequency difference output, a frequency aging estimate output and an estimated frequency-drift to provide an increased accuracy frequency estimation with a reduced random noise susceptibility.

14. The recursive proportional-delayed zero-crossing estimator device, as recited in claim 13, further comprising said converter converts a continuous periodic waveform to a square waveform with an equivalent repetition rate and a plurality of steep zero-crossing edges for an enhanced zero-crossing detection.

15. The recursive proportional-delayed zero-crossing estimator device, as recited in claim 14, further comprising said positive delay threshold, α, being adjustable based on a signal-to-noise ratio of said signal g(x).

16. The recursive proportional-delayed zero-crossing estimator device, as recited in claim 15, further comprising said repetition-rate estimation being calculated according to the equation:

$$z(k) = \frac{1}{N-2} \cdot \left[ \sum_{i=0}^{N-3} y(k-i) - \sum_{i=0}^{N-3} y(k-1-i) \right]$$

$$= K \cdot \sum_{i=0}^{N-3} q(k-i)$$

$$= K \cdot \sum_{i=-1}^{N-4} q(k-i-1)$$

$$= z(k-1) + K \cdot [q(k) - q(k-N+2)]$$

where said $K=K_f/(N-2)$ is a calibration constant and said D is a one-step delay operator where $D[y(k)]=y(k-1)$.

17. The recursive proportional-delayed zero-crossing estimator device, as recited in claim 16, further comprising said signal repetition estimation means including a delayer, a number of shift registers, a shift register output, adders, a feedback loop and an amplifier.

18. The recursive proportional-delayed zero-crossing estimator device, as recited in claim 17, further comprising:
said counter output, having a proportional path, is sent to a delayer, said delayer providing a delayed path;
a first adder combines said proportional path and said delayed path and provides a first adder output to a first plurality of shift registers;
said first plurality of shift registers provide a shift register output to a second adder that forms a combined output receiving a gain adjustment from said amplifier;
said amplifier provides a filtered output to a third adder and a feedback loop from a second plurality of shift registers provides a feedback, z(k−1), to said third adder; and
said third adder provides a filtered estimated result output, z(k), said filtered estimated result output, z(k), being calibrated by a gain K from said amplifier, is sent to said the signal modulation type analysis means.

* * * * *